United States Patent
Chen

(10) Patent No.: US 6,843,310 B1
(45) Date of Patent: Jan. 18, 2005

(54) SEMI-CLOSED AIR COOLING TYPE RADIATOR

(76) Inventor: Chin-Ping Chen, P.O. Box 697, Feng-Yuan City, Taichung Hsien (TW), 420

( * ) Notice: Subject to any disclaimer, the term of this patent is extended or adjusted under 35 U.S.C. 154(b) by 0 days.

(21) Appl. No.: 10/790,731

(22) Filed: Mar. 3, 2004

(51) Int. Cl.[7] ............................... F24H 3/02
(52) U.S. Cl. ............... 165/121; 165/80.3; 165/104.33; 454/185; 361/697
(58) Field of Search .................. 165/121, 122, 165/80.3, 185, 104.21, 104.33; 361/695, 697; 257/712, 722, 721; 454/185

(56) References Cited

U.S. PATENT DOCUMENTS

| | | | | |
|---|---|---|---|---|
| 3,327,776 A | * | 6/1967 | Butt | 165/80.4 |
| 4,109,707 A | * | 8/1978 | Wilson et al. | 165/46 |
| 4,644,385 A | * | 2/1987 | Nakanishi et al. | 257/713 |
| 4,686,606 A | * | 8/1987 | Yamada et al. | 361/699 |
| 5,473,508 A | * | 12/1995 | Porter et al. | 361/695 |
| 5,583,316 A | * | 12/1996 | Kitahara et al. | 174/16.3 |
| 5,646,824 A | * | 7/1997 | Ohashi et al. | 361/699 |
| 5,731,954 A | * | 3/1998 | Cheon | 361/699 |
| 6,148,907 A | * | 11/2000 | Cheng | 165/121 |
| 6,166,907 A | * | 12/2000 | Chien | 361/699 |
| 6,191,945 B1 | * | 2/2001 | Belady et al. | 361/704 |
| 6,305,463 B1 | * | 10/2001 | Salmonson | 165/80.3 |
| 2002/0070007 A1 | * | 6/2002 | Calaman et al. | 165/80.4 |

* cited by examiner

Primary Examiner—Terrell McKinnnon

(57) ABSTRACT

A semi-closed air cooling type radiator includes a rectangular framed main body having four side walls connected on the corners by four cylindrical posts, a plurality of vertical radiation fins spacedly disposed on outer surface of the side walls, a plurality of diagonal partitions spacedly disposed inside the main body each having one end connected to the side wall and the other end being an indenture so as to form an air circulation system therein. A rectangular lid covers the top of the main body having a pair cylindrical tubes on opposing corners respectively communicating to the beginning and the end of the air circulation system, an air circulation set having a first air guiding pipe connected to the beginning and an air flow actuator and a second air guiding pipe connected between the end and an air vent. In an alternate arrangement on air circulation set can serve a series of radiators by increasing an additional air guiding pipe between the adjacent radiators.

4 Claims, 3 Drawing Sheets

(2-2)

SEMI-CLOSED AIR COOLING TYPE RADIATOR

BACKGROUND OF THE INVENTION

The present invention relates to radiator useful to the electronic components and more particularly to a semi-closed air cooling type radiator.

Generally, the prior art air cooling type radiator is secured to the top of the CPU of a computer. This type of radiator has an air fan to blow the radiator itself to achieve the heat radiation effect. But the cooling air blew by the air fan is coming from inside of the computer. After a long period of continuous circulation, the temperature of the air inside the computer should be come higher and higher that radiation effect of the radiator would be gradually reduced. Further, this type of radiator could only perform the radiation on the important point but could not guide the cooling air to everywhere of the radiator. Therefore, the radiator effect is not perfect. Besides, the noise of the air fan disturbes the operator.

SUMMARY OF THE PRESENT INVENTION

The present invention has a main object to provide a semi-closed air cooling type radiator which can be able to guide the external natural air or refrigerant into the radiator to evenly reduce the temperature in the radiator in order to greatly promote the radiation effect.

Accordingly, the semi-closed cooling air type radiator of the present invention comprises generally a rectangular framed main body having an opened top, a plurality of partitions diagonally, spacedly and alternately disposed inside the main body and each having a indenture at free end so as to define an air circulation system therein and a rectangular lid covering the top of the main body. The rectangular lid has a first and a second air vents on opposing corners respectively communicating with the inlet and the outlet of the air circulation system. A set of additional air flow system is provided in the computer and connected between the external of the computer and the lid and includes a first air pipe connected with the first air vent and a second air pipe connected with the second air vent. The other end of the first air pipe connects with an air flow actuator on the top of the computer for compulsively forming an air flow circulation in the entire radiator in order to greatly promote the radiation effect to ensure the stability of the electronic components in the computer.

The present invention will become more fully understood by reference to the following detailed description there of when read in conjunction with the attached drawings.

DETAILED DESCRIPTION OF THE PREFERRED EMBODIMENT

Figure 1:
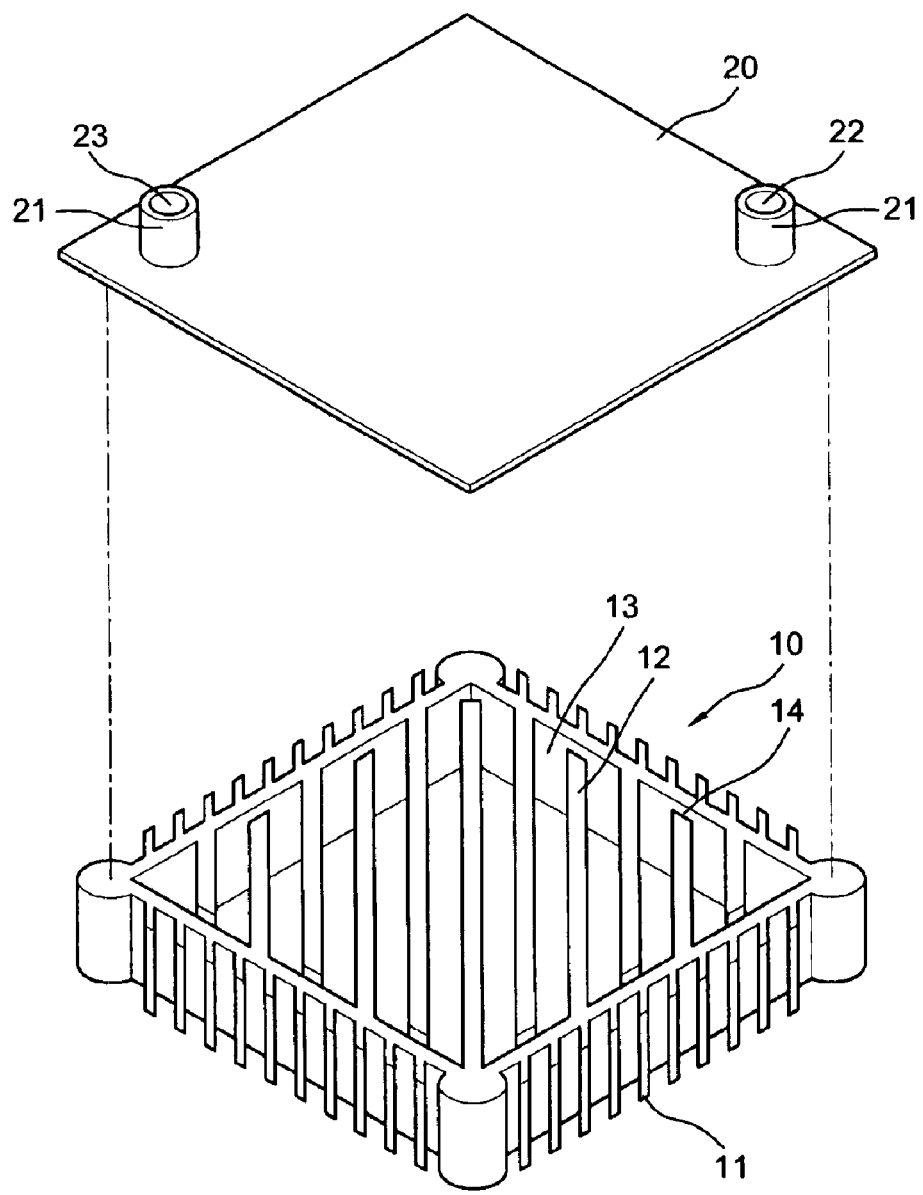
FIG. 1 is an exploded perspective view of a semi-closed air cooling type radiator of the preferred embodiment of the present invention.
Figure 2:
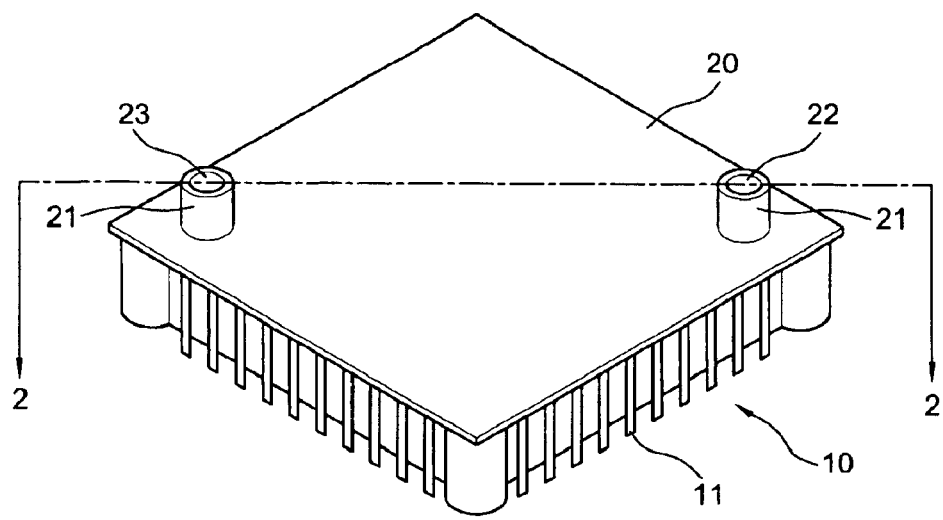
FIG. 2 is a perspective view to show the assembly of FIG. 1.
Figure 3:
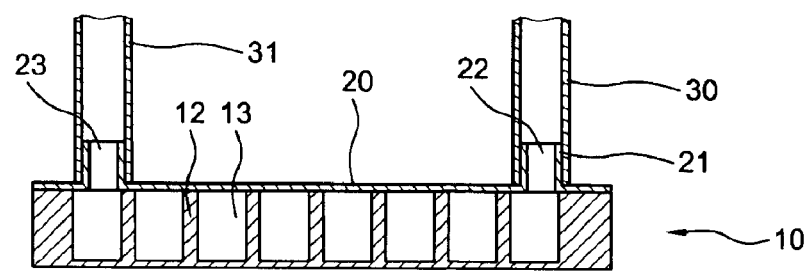
FIG. 3 is a sectional view taken along line 2—2 of FIG. 2.

With reference to FIGS. 1, 2 and 3 of the drawings, the semi-closed air cooling type radiator of the present invention comprises a rectangular framed main body 10 disposed on the CPU 41 of a computer 40 and has four side walls connected on the corners by four cylindrical posts, an opened top, a plurality of vertical radiation fins 11 spacedly disposed on the outer surface of the side walls and a plurality of diagonal partitions 12 spacedly and alternately disposed inside the main body 10 each having one end connected to an inner surface of the side walls and the other end having an indenture 14 between the inner surface of the side wall so as to form an air circulation system 13 in the main body 10.

A rectangular lid 20 covers the top of the main body 10 and has a pair of cylindrical tubes 21 spacedly projected upward from the opposing corners and an air inlet 22 and an air outlet 23 respectively formed in the cylindrical tubes 21 communicating to the beginning and the end of the air circulation system 13 relatively.

Figure 4:
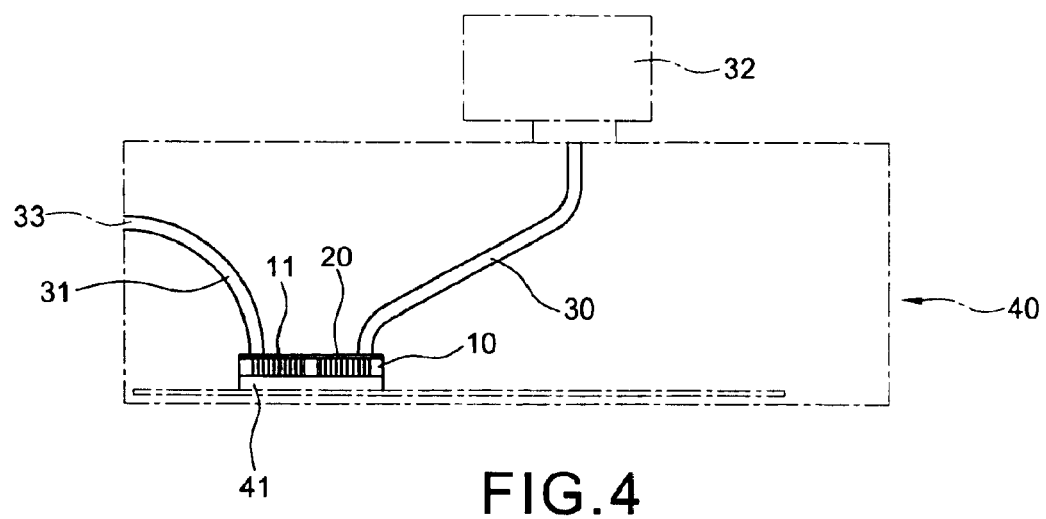
FIG. 4 is an elevational view to show that the air cooling 1/type radiation of the present invention assembled to a CPU of a computer.

An air circulation set includes a first air guiding pipe 30 having one end connected to the air inlet 22 and the other end connected to an air flow actuator 32 on the top of a computer 40 and a second air guiding pipe 31 having one end connected to the air outlet 23 and the other end to an air vent 33 in a lateral wall of the computer 40 (as shown in FIG. 4). Wherein the air flow actuator 32 may be able to guide the fresh air or the refrigerant from external resource into the air circulation system 13 of the main body 10 to reduce the temperature in the partitions 12 by heat exchange and the air vent 33 is functioned to exhaust the hat air from the air circylation system 13 to outside of the radiator.

In other consideration, the air flow actuator 32 may be disposed inside the computer 40 or any other outer surface of the computer 40 in order to reduce the noise to disturbes the operator. If the air flow actuator 32 is functioned to exhaust the heat air from the air circulation system 13 and the fresh air is guided in from the air vent 33, it also be able to achieve the cooling off job for the radiator.

Figure 5:
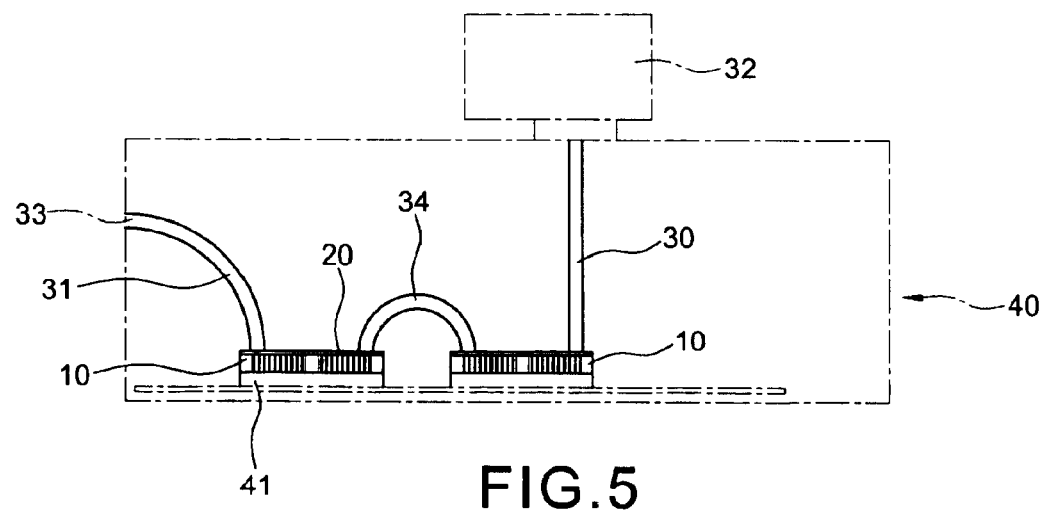
FIG. 5 is an elevational view to show that the air cooling type radiation is assembly to the CPU of a computer in series state.

FIG. 5 slows an alternate arrangement in which a pair of the air cooling type radiators are connected by an additional air guiding pipe 34 between their air inlet 22 and air outlet 23. The original first air guiding pipe 30 is still connected between the air inlet 22 of a first air cooling type radiator and the air flow actuator 32 and original second air guiding pipe 31 is still connected between the air outlet 23 of a second air cooling type radiator and the air vent 33. When the fresh air enters into the air circulation system 13 of the first radiator and then enters into the air circulation system 13 of the second radiator via the additional air guiding pipe 34 and finally exhausts out from the air vent 33 through the second air guiding pipe 31, the purpose of using one air guiding set simultaneously radiating the heat air in the two radiators are achieved.

Note that the specification relating to the above embodiment should be construed as an exemplary rather than as a limitative of the present invention, with many variations and modifications being readily attainable by a person of average skill in the art without departing from the spirit or scope thereof as defined by the appended claims and their legal equivalents.

I claim:

1. A semi-closed air cooling type radiator comprising:

a rectangular framed main body disposed on a CPU of a computer and having four side walls connected on corners by four cylindrical costs, an opened top and a plurality of vertical radiation fins spacedly disposed outer surface of said four side walls and a plurality of diagonal partition spacedly and alternately disposed inside said main body each having one end connected to an inner surface of said side walls and another end having an indenture between inner surface of said side wall so as to define an air circulation system in said main body in including a beginning and an end thereof;

a rectangular lid covering the opened top of said main body having a pair of cylindrical tubes spacedly projected upward from opposing corners and an air inlet and air cutlet respectively formed in said cylindrical tubes and relatively communicated to the beginning and the end of said air circulation system in said main body;

an air circulation set having a first air guiding pipe including one end connected to the air inlet of said lid and another end connected to an air flow actuator on a top of a computer and a second air guiding pipe including one end connected to the air outlet of said lid and another end connected to an air vent in a lateral wall of said computer;

whereby, said air flow actuator guides external fresh air and refrigerant into said circulation system to cool up said radiator and said air vent exhausts the heat air from said air circulation system.

2. The air cooling type radiator as recited in claim 1, wherein said air flow actuator can be used to exhaust the hot air from said air circulation system where said air vent guides the fresh air into said air circulation system.

3. The air cooling type radiator as recited in claim 1, wherein said air flow actuator may be disposed inside a computer.

4. The air cooling type radiator as recited in claim 1, wherein said air circulation set can be able to serve for more then a pair of series connected radiators simultaneously by adding an addition air guiding pipe between said adjacent radiators.

* * * * *